(12) United States Patent
Kim et al.

(10) Patent No.: US 12,724,068 B2
(45) Date of Patent: Sep. 1, 2026

(54) TRAINING METHOD AND TEST APPARATUS USING THE SAME

(71) Applicant: Samsung Electronics Co., Ltd., Suwon-si (KR)

(72) Inventors: Kwang Kyu Kim, Suwon-si (KR); Jae-Il Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 730 days.

(21) Appl. No.: 18/158,181

(22) Filed: Jan. 23, 2023

(65) Prior Publication Data

US 2023/0417832 A1 Dec. 28, 2023

(30) Foreign Application Priority Data

Jun. 28, 2022 (KR) ........................ 10-2022-0078698

(51) Int. Cl.
*G11C 16/04* (2006.01)
*G01R 31/317* (2006.01)
*G01R 31/3193* (2006.01)

(52) U.S. Cl.
CPC . *G01R 31/31726* (2013.01); *G01R 31/31937* (2013.01)

(58) Field of Classification Search
CPC .................... G01R 31/31726; G01R 31/31937
See application file for complete search history.

(56) References Cited

U.S. PATENT DOCUMENTS 8,605,539 B2 12/2013 Haldar et al.
9,257,200 B2 2/2016 Bhakta et al.
9,639,495 B2 5/2017 Dearth et al.
10,943,183 B2 3/2021 Cha
11,017,839 B2 5/2021 Hsieh et al.
11,061,577 B2 7/2021 Kim
2011/0199133 A1* 8/2011 Yamada ........... G01R 31/31922 327/141

(Continued)

FOREIGN PATENT DOCUMENTS

KR 1020120037184 A 4/2012
KR 1020130032505 A 4/2013

(Continued)

OTHER PUBLICATIONS

Notice of Allowance in Korean Appln. No. 10-2022-0078698, mailed on May 7, 2026, 5 pages (with English translation).

*Primary Examiner* — Pho M Luu
(74) *Attorney, Agent, or Firm* — Fish & Richardson P.C.

(57) ABSTRACT

Provided is a training method capable of reducing or minimizing a training time. The training method includes, for each of devices to be tested, calculating a first eye width at which a first signal and a second signal synchronize with each other at a first operation speed, and calculating a second eye width at which the first signal and the second signal synchronize with each other at a second operation speed different from the first operation speed; performing machine learning on the first eye width and the second eye width to derive a model showing a relation between operation speeds and eye widths; and calculating a third eye width corresponding to a third operation speed different from the first operation speed and the second operation speed, using the model.

20 Claims, 14 Drawing Sheets

(56) References Cited

U.S. PATENT DOCUMENTS

| | | | | |
|---|---|---|---|---|
| 2012/0216086 | A1* | 8/2012 | Fujisaki | G11C 29/56008 714/E11.17 |
| 2020/0293415 | A1 | 9/2020 | Mukherjee et al. | |
| 2022/0215893 | A1* | 7/2022 | Tang | G11C 29/40 |

FOREIGN PATENT DOCUMENTS

| | | | |
|---|---|---|---|
| KR | 1020170008062 | A | 1/2017 |
| KR | 1020170038977 | A | 4/2017 |
| KR | 1020180060669 | A | 6/2018 |
| KR | 1020180079995 | A | 7/2018 |
| KR | 1020190096753 | A | 8/2019 |
| KR | 1020200049985 | A | 5/2020 |
| KR | 1020200078991 | A | 7/2020 |
| KR | 1020200092652 | A | 8/2020 |
| KR | 2021-0133832 | A | 11/2021 |

* cited by examiner

TRAINING METHOD AND TEST APPARATUS USING THE SAME

CROSS-REFERENCE TO RELATED APPLICATION

This application claims priority from Korean Patent Application No. 10-2022-0078698 filed on Jun. 28, 2022 in the Korean Intellectual Property Office, and all the benefits accruing therefrom under 35 U.S.C. 119, the contents of which in its entirety are herein incorporated by reference.

BACKGROUND

Various example embodiments relate to a training method and/or a test apparatus using the same.

There is a need or desire to perform a training operation in advance so that a data signal DQ and a data strobe signal DQS may be synchronized, before an automated test equipment (ATE) tests functions of a memory device (e.g., DDR5).

The automated test equipment that adopts hardware blocks optimized or improved for the training operation may perform training operations at high speed. However, in the case of the automated test equipment that does not adopt such hardware blocks, there is a need or desire to find and compensate for fail-to-pass points for each memory device to be tested, using software. A training time significantly increases accordingly.

SUMMARY

Aspects of various example embodiments provide a training method capable of reducing or minimizing a training time.

Alternatively or additionally, various example embodiments may also provide a test apparatus that uses a training method with a reduced minimized training time.

However, example examples are not restricted to the one set forth herein. The above and other aspects will become more apparent to one of ordinary skill in the art to which various example embodiments pertains by referencing the detailed description given below.

A training method according to various example embodiments includes calculating a first eye width at which a first signal and a second signal synchronize with each other at a first operation speed, and calculating a second eye width at which the first signal and the second signal synchronize with each other at a second operation speed different from the first operation speed, for each of first devices to be tested; performing machine learning on the first eye width and the second eye width so as to derive a model showing a relation between the operation speed and the eye width; and calculating a third eye width corresponding to a third operation speed different from the first operation speed and the second operation speed, by using the model.

Alternatively or additionally, a training method according various example embodiments includes, for each of first devices to be tested, calculating a first eye width at which a first signal and a second signal synchronize with each other at a first operation speed, and calculating a second eye width at which the first signal and the second signal synchronize with each other at a second operation speed different from the first operation speed; performing machine learning on the first eye width and the second eye width so as to derive a linear regression model showing a relation between the operation speed and the eye width; calculating parameters of the linear regression model using a gradient descent method; calculating a third eye width corresponding to a third operation speed different from the first or second operation speed by using the linear regression model; finding a third fail-to-pass point, while adjusting the delay of the first signal at the third operation speed; and determining from the third fail-to-pass point another point obtained by adding the third eye width to the third fail-to-pass point, as a position of the valid window margin.

Alternatively or additionally, a test apparatus according to various example embodiments comprises output nodes configured to electrically connect to first devices to be tested; a timing generating circuit configured to provide a first signal and a second signal to the first devices to be tested through the output nodes; and a controller configured to control the timing generator. The controller is configured to calculate a first eye width at which a first signal and a second signal synchronize with each other at a first operation speed, and to calculate a second eye width at which the first signal and the second signal synchronize with each other at a second operation speed different from the first operation speed, for each of first devices to be tested. The controller is configured to perform machine learning on the first eye width and the second eye width so as to derive a model showing a relation between the operation speed and the eye width. The controller is configured to calculate a third eye width corresponding to a third operation speed different from the first operation speed and the second operation speed, by using the model.

Specifics of these and other various example embodiments are included in the detailed description and drawings.

BRIEF DESCRIPTION OF THE DRAWINGS

The above and other aspects and features will become more apparent by describing in detail various example embodiments thereof with reference to the attached drawings, in which.

DETAILED DESCRIPTION OF VARIOUS EXAMPLE EMBODIMENTS

Figure 1:
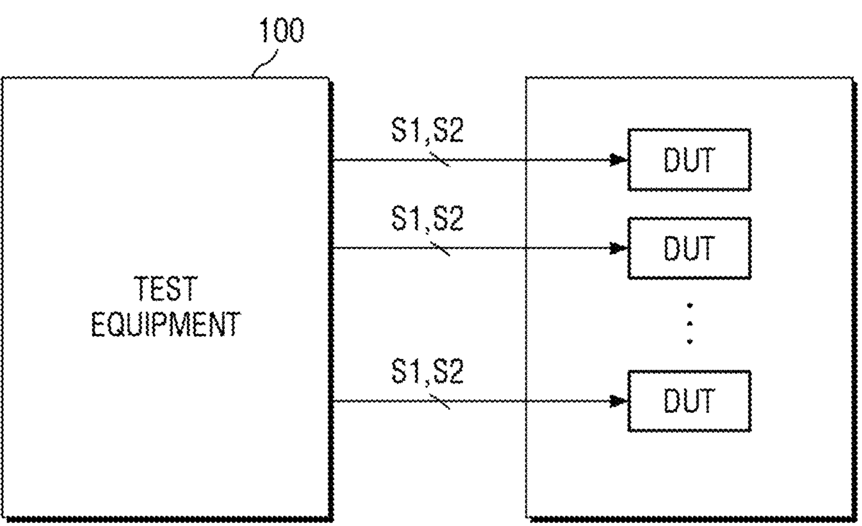
FIG. 1 is a diagram for explaining a test apparatus according to some example embodiments.

Various example embodiments are described in detail below with reference to the accompanying drawings. The same reference numerals are used for the same components on the drawings, and repeated descriptions thereof will not be provided.

Figure 2:
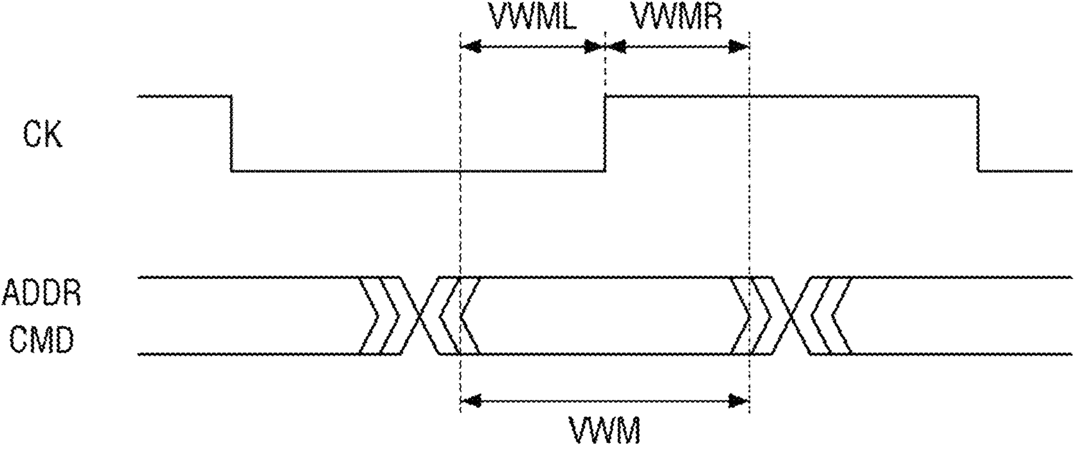
FIGS. 2 and 3 are diagrams for explaining a sync between a first signal and a second signal shown in FIG. 1.
Figure 3:
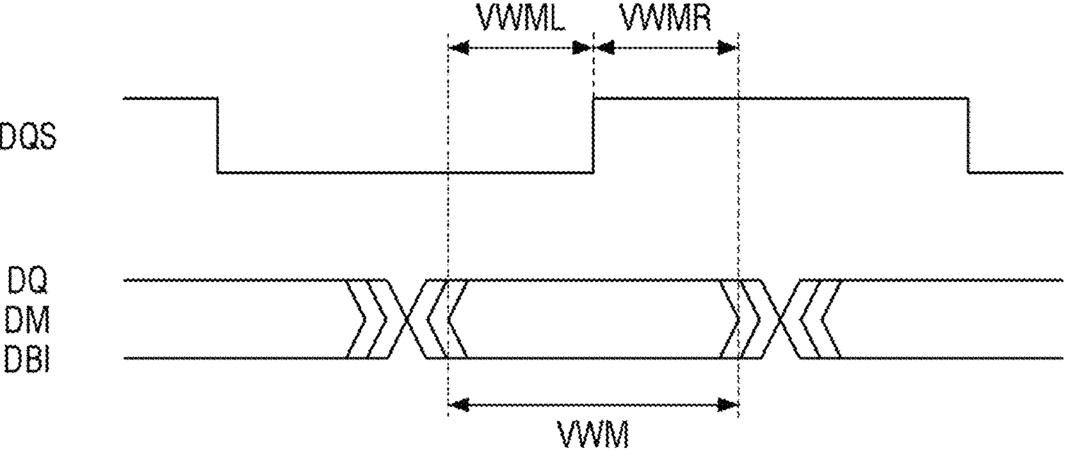

FIG. 1 is a diagram for explaining a test apparatus according to some example embodiments. FIGS. 2 and 3 are diagrams for explaining the sync between a first signal S1 and a second signal S2 shown in FIG. 1.

Referring to FIG. 1 first, a test apparatus 100 according to some example embodiments tests a plurality of devices to be tested, or devices under test (DUT).

The test apparatus 100 may perform, for example, one or more of a DC test, a functional test, a parametric test, and the like. The DC test applies a DC voltage to the device to be tested to test the DC characteristics of the device to be tested. Here, the DC characteristics may include, for example, but are not limited to, the presence or absence of open and short circuits in the device to be tested, magnitudes of input/output currents and/or voltages, and the like. The functional test provides test pattern data to the device to be tested to test the functional characteristics of the device to be tested. Here, the functional characteristics include, but not limited to, write and/or read performance of the device to be tested, data transfer performance in paths formed in the process of testing the write and read performance, retention testing, speed testing, and the like.

The test apparatus 100 may generate commands and addresses to perform the DC test, the functional test, and the like described above. Furthermore, the test apparatus 100 may generate test pattern data. For example, the test apparatus 100 may be or may include automated test equipment (ATE).

On the other hand, the device to be tested DUT may be any semiconductor device that requires or uses a training operation for at least two signals to match the synch with each other. The device to be tested DUT may be or may include a memory device, for example, a volatile memory such as a static random-access memory (SRAM) and/or a dynamic random-access memory (DRAM), and a non-volatile memory such as a flash memory and/or a resistive random access memory (RRAM). For convenience of explanation, a case where the device to be tested is a DRAM will be described below as an example.

In a fourth-generation double data rate (DDR4) DRAM device, the clock signal CK and the data strobe signal DQS are in a matched relation in the write leveling, and the data signal DQ and the data strobe signal DQS are in a matched relation in the write training. Taking the write leveling as an example, since the command signal CMD through the clock signal CK may travel a longer distance than the data strobe signal DQS, the command signal CMD may be slower than the data strobe signal DQS. In this respect, since a replica delay is applied to the data strobe signal DQS node, the signals synchronize with each other.

However, in a fifth-generation double data rate (DDR5) DRAM device, the replica delay described above is not applied in internal write leveling. Therefore, the signals do not match with each other. In such cases, the test apparatus 100 needs to perform a training operation to match the sync between the signals.

The test apparatus 100 performs a training operation to match the sync between the first signal S1 and the second signal S2.

Referring to FIG. 2, the first signal S1 may be or may include an address signal ADDR and/or a command signal CMD, and the second signal S2 may be or may include a clock signal CK. The address signal ADDR and/or the command signal CMD needs to or is expected to match the synch with the clock signal CK.

As shown, the address signal ADDR and the command signal CMD may be required or expected to be kept constant before and after a rising edge and a falling edge of the clock signal CK. A section in which the address signal ADDR and the command signal CMD are kept constant before and after the (rising) edge of the clock signal CK may be referred to as a valid window margin VWM or an eye. The valid window margin VWM may include a first section VWML (which may be referred to as a setup time) before the edge of the clock signal CK, and a second section VWMR (which may be referred to as a hold time) after the edge of the clock signal CK. When the address signal ADDR and/or the command signal CMD are transmitted in parallel as multi-bit signals through the multiple lanes or multiple pins, the valid window margin VWM of the address signal ADDR and/or the command signal CMD may correspond to a small or minimum valid window margin VWM among a corresponding plurality of valid window margins.

Also, referring to FIG. 3, the first signal S1 may be or may correspond to a data signal DQ, a data mask signal DM, and a data bus inversion signal DBI, and the second signal S2 may be or may correspond to a data strobe signal DQS. The data signal DQ, the data mask signal DM, and/or the data bus inversion signal DBI need to or are expected to match the synch with data strobe signal DQS.

The data signal DQ, the data mask signal DM, and the data bus inversion signal DBI may be required or expected to be kept constant before and after the rising edge and falling edge of the data strobe signal DQS. A section in which the data signal DQ, the data mask signal DM, and the data bus inversion signal DBI are kept constant before and after the edge of the data strobe signal DQS may be referred to as a valid window margin VWM and/or an eye such as a data eye. The valid window margin VWM may include a first section VWML before the (rising) edge of the data strobe signal DQS, and a second section VWMR after the (rising) edge of the data strobe signal DQS.

The signals described above using FIGS. 2 and 3 are merely examples of the first signal S1 and the second signal S2, and are not limited thereto.

On the other hand, a width (or an eye width) of the valid window margin VWM may vary depending on various factors such as the operation speed of the signal. If the operation speed of the signal is high, the eye width may decrease, and if the operation speed of the signal is low, the eye width may increase. Therefore, if the operation speed of the signals is high, it may be difficult to match the synch between the signals, and if the operation speed of the signals is low, it may be easier to match the synch between the signals.

Figure 4:
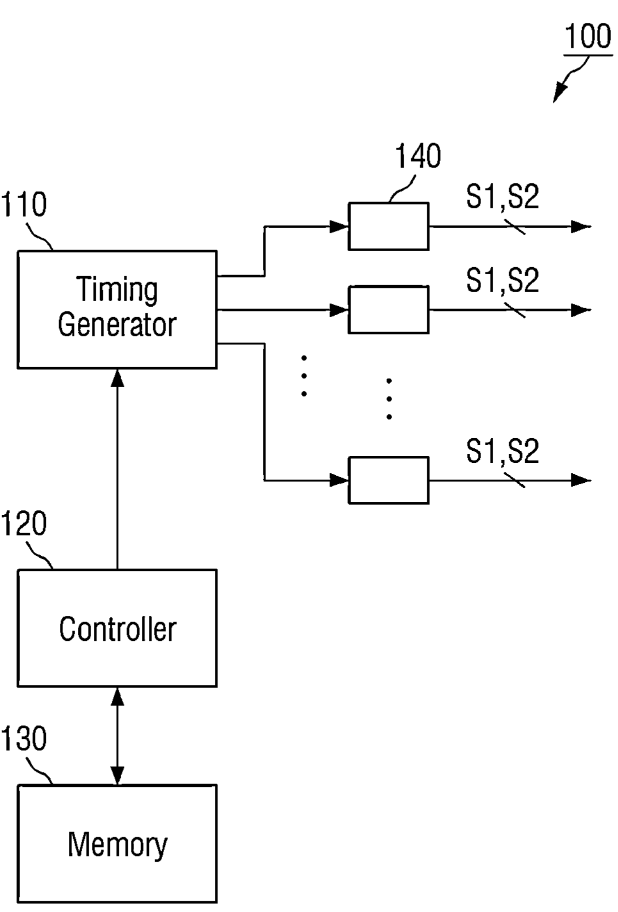
FIG. 4 is a block diagram for explaining various example configuration of the test apparatus of FIG. 1.

FIG. 4 is a block diagram for explaining an example configuration of the test apparatus of FIG. 1.

Referring to FIG. 4, the test apparatus 100 includes a plurality of output nodes 140, a timing generator 110, a controller 120 and a memory 130.

Each of or at least some of the plurality of output nodes 140 is electrically connected to the corresponding device to be tested or device under test DUT. A first signal S1 and a second signal S2 are provided to the corresponding device to be tested through the output node 140.

The timing generator 110 generates the first signal S1 and the second signal S2 by control of the controller 120.

The controller 120 controls the timing generator 110 on the basis of software instructions stored in the memory 130. The controller 120 controls the timing generator 110 to perform a DC test, a training operation, a functional test, and the like.

As an example of the training operation, the controller 120 controls the timing generator 110, and adjusts the delay of the first signal S1 (or adjusts the driving edge of the first signal S1) to match the sync between first signal S1 and second signal S2 at a first operation speed (e.g., 2.4 Gbps). The controller 120 controls the timing generator 110 to gradually change the delay, and the controller 120 finds a first fail-to-pass point and/or a first pass-to-fail point. The controller 120 calculates the first eye width at the first operation speed, using the first fail-to-pass point and the first pass-to-fail point.

Similarly, the delay of the first signal S1 is adjusted to match the synchronization between the first signal S1 and the second signal S2 at the second operation speed (e.g., 6.4 Gbps). The controller 120 controls the timing generator 110 to gradually change the delay, and the controller 120 finds a second fail-to-pas point and/or a second pass-to-fail point. The controller 120 calculates the second eye width at the second operation speed, using the second fail-to-pass point and the second pass-to-fail point.

The controller 120 performs machine learning on the first eye width and the second eye width to derive a model (e.g., a linear regression model) showing a relation between the operation speed and the eye width. A gradient descent method may be used to calculate the parameters of the linear regression model.

The controller 120 calculates a third eye width that corresponds to a third operation speed (e.g., 3.2 Gbps) different from the first operation speed and the second operation speed, by the use of the derived model (i.e., formula).

The controller 120 may determine the position of the valid window margin (VWM) at the third operation speed, using the calculated third eye width.

For example, a third fail-to-pas point may be found, while adjusting the delay of the first signal S1 at the third operation speed. Subsequently, a position from the third fail-to-pass point to a point, which is obtained by adding the calculated third eye width to the third fail-to-pass point, may be determined as a position of the valid window margin.

Alternatively or additionally, a third pass-to-fail point is found, while adjusting the delay of the first signal S1 at the third operation speed. Then, a position from a point, which is obtained by subtracting the third eye width from the third pass-to-fail point, to the third pass-to-fail point may be determined as a position of the valid window margin.

In some example embodiments, the controller 120 may be implemented as a single processor, or may be implemented as multiple processors.

Hereinafter, an operation (for example, a training operation) in which the first signal S1 matches the synch with the second signal S2 will be described in more detail.

Figure 5:
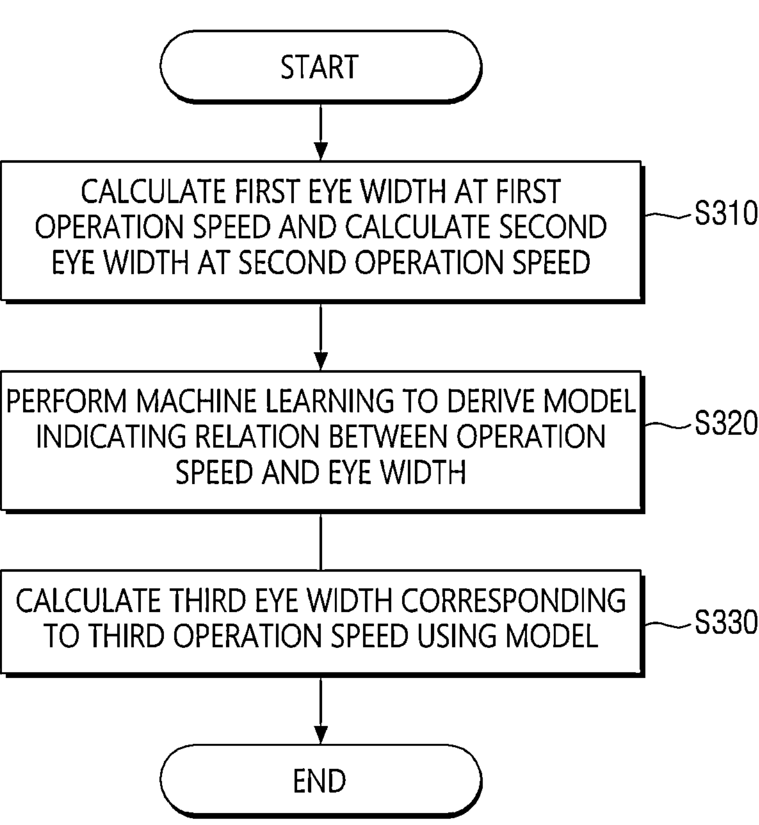
FIG. 5 is a flowchart for explaining a training method according to various example embodiments.
Figure 6:
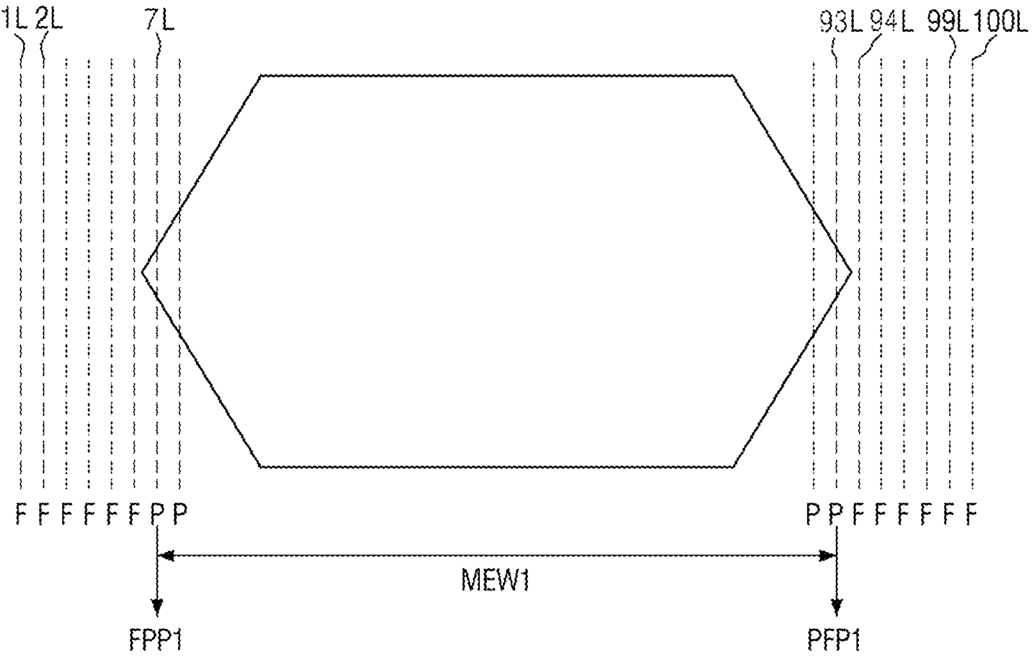
FIGS. 6 to 8 are diagrams for explaining step S310 of FIG. 5.
Figure 7:
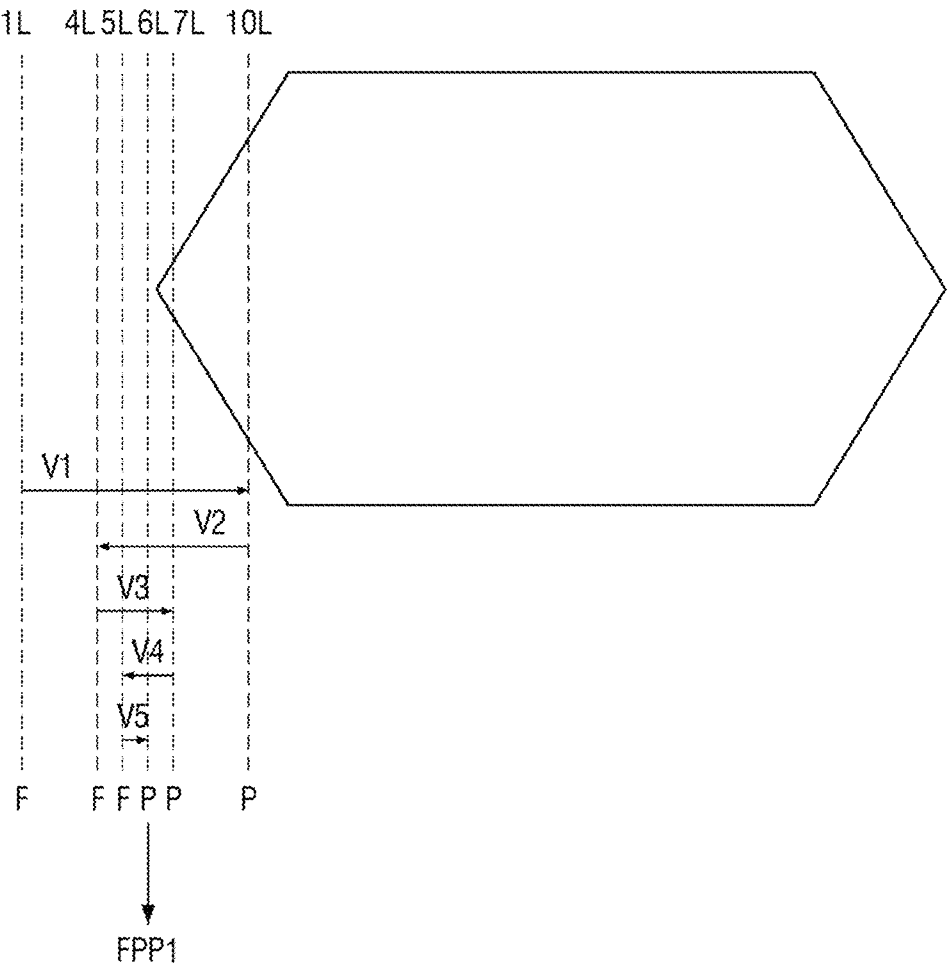
Figure 8:
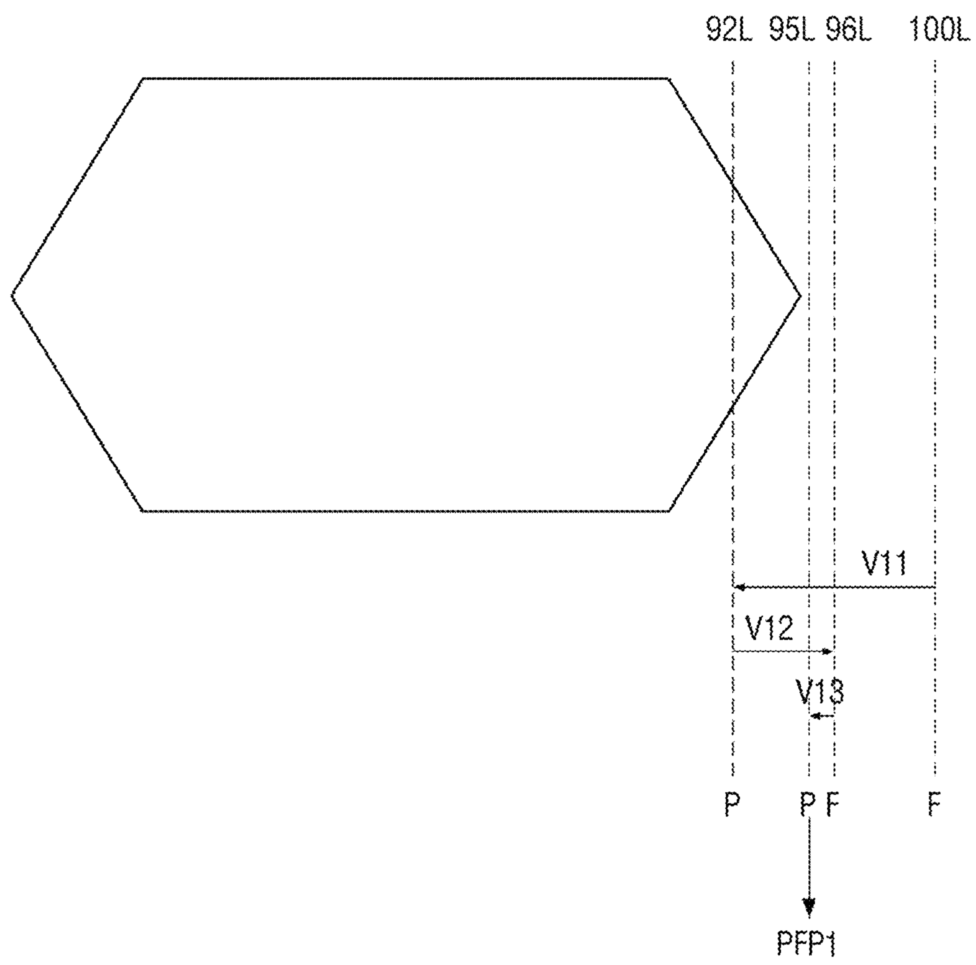
Figure 9:
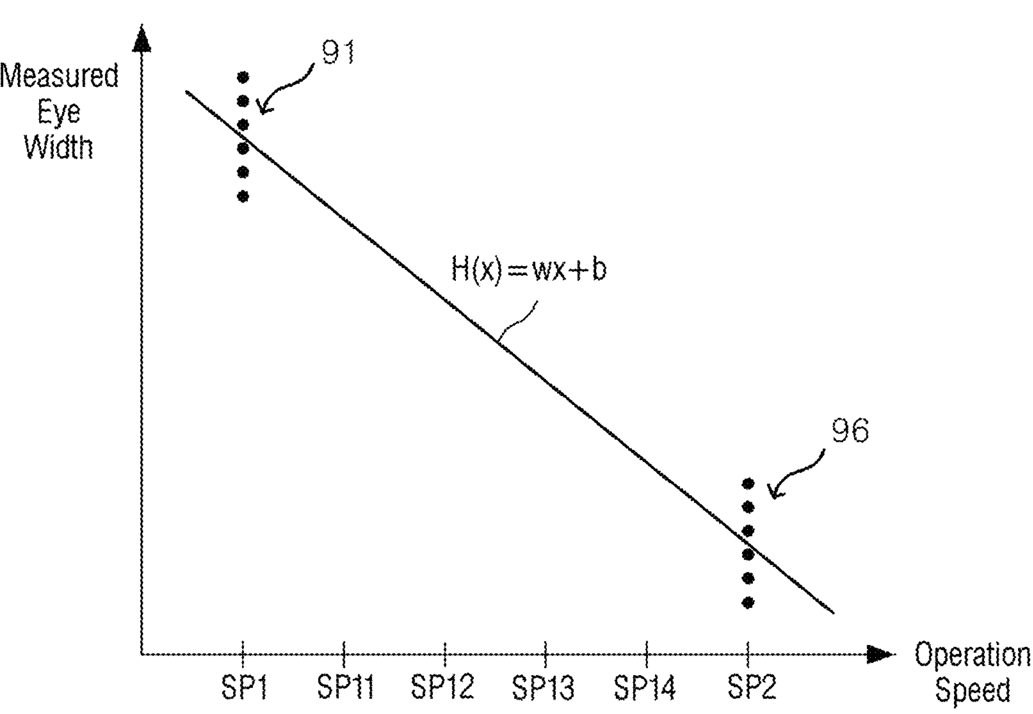
FIG. 9 is a diagram for explaining step S320 of FIG. 5.
Figure 10:
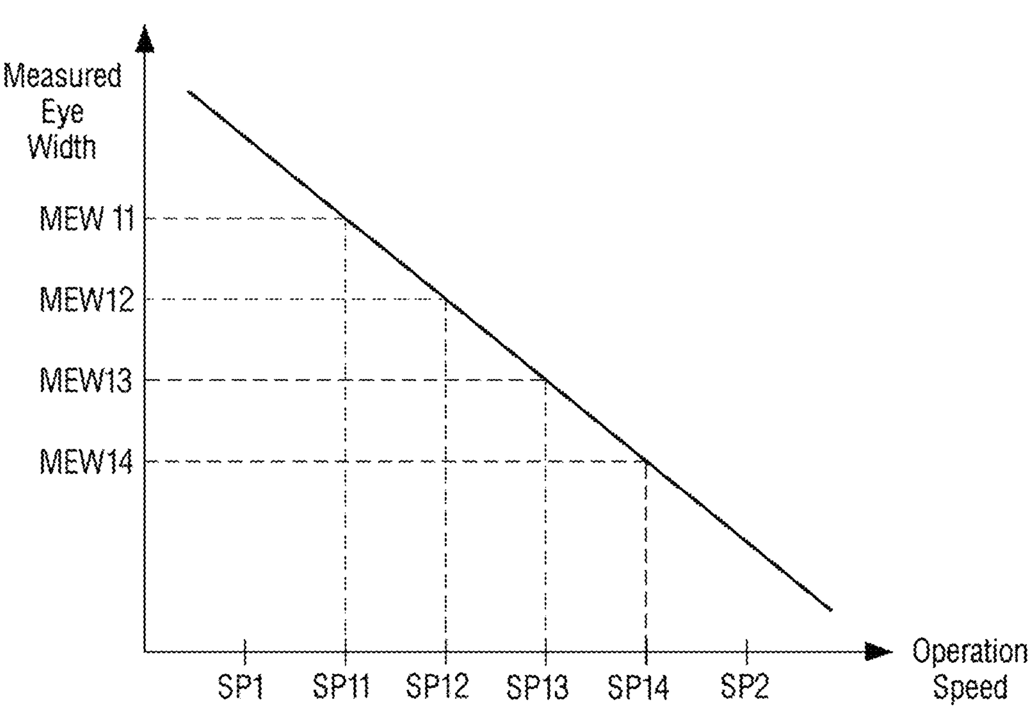
FIG. 10 is a diagram for explaining step S330 of FIG. 5.

FIG. 5 is a flowchart for explaining a training method according various example embodiments. FIGS. 6 to 8 are diagrams for explaining step S310 of FIG. 5. FIG. 9 is a diagram for explaining step S320 of FIG. 5. FIG. 10 is a diagram for explaining step S330 of FIG. 5.

Referring to FIG. 5, the first eye width at the first operation speed is calculated, and the second eye width at the second operation speed is calculated (S310).

For each of the plurality of first devices to be tested, the first eye width MEW1 at which the first signal S1 at the first operation speed SP1 matches the synch with the second signal S2 is calculated, and the second eye width MEW2 at which the first signal S1 at the second operation speed SP2 different from the first operation speed SP1 matches the synch with the second signal S2 is calculated.

When the operation speeds of the signals S1 and S2 change, the eye width for matching the sync between the signals S1 and S2 changes. The higher the operation speeds of the signals S1 and S2 are, the smaller the eye width is, and the lower the operation speeds of the signals S1 and S2 are, the greater the eye width is. For example, in some example embodiments the eye width when the operation speed of the signals S1 and S2 is 2.4 Gbps is greater than the eye width when the operation speed of the signals S1 and S2 is 6.4 Gbps.

A method of calculating the eye width will now be described using FIGS. 6 to 8.

Referring to FIG. 6 first, calculation of the first eye width MEW1 includes finding of the first time of the first fail-to-pass point FPP1 and the first time of the first pass-to-fail point PFP1 while adjusting the delay of the first signal S1 at the first operation speed SP1, and determination of the interval between the first fail-to-pass point FPP1 and the first pass-to-fail point PFP1 as the first eye width MEW1.

For example, if a search section for calculating the eye width MEW1 is 2 ns, the delay of the first signal S1 at the first operation speed SP1 (e.g., 2.4 Gbps) is changed little by little. The delay may be changed, by dividing the search section into dynamically determined or predetermined sections. If the search section is divided into, for example, 100 sections, it may be divided into 100 delays (1L, 2L, . . . 99L, 100L) as shown in FIG. 6. The time between adjacent delays may be 20 ps (=2 ns/100).

When the first signal S1 has a first delay 1L, the first signal S1 fails to match the synch with the second signal S2 (i.e., fail (F)).

When the first signal S1 has a second delay 2L, the first signal S1 fails to match the synch with the second signal S2 (i.e., fail (F)).

If the delay is gradually increased in this manner, when the first signal S1 has a seventh delay 7L, the first signal S1 initially matches the synch with the second signal S2 (i.e. pass (P)).

In this case, the point on which the first signal S1 initially matches the synch with the second signal S2 is defined as the first fail-to-pas point FPP1.

On the other hand, when the first signal S1 has a ninety-third delay 93L, the first signal S1 matches the synch with the second signal S2 (i.e., pass (P)).

When the first signal S1 has a ninety-fourth delay 94L, the first signal S1 fails to match the synch with the second signal S2 (i.e., fail (F)).

In this case, the point on which the first signal S1 finally matches the synch with the second signal S2 may be defined as the first pass-to-fail point PFP1.

An interval between the first fail-to-pass point FPP1 and the first pass-to-fail point PFP1 is determined as the first eye width MEW1. For example, if the first fail-to-pass point FPP1 is 140 ps (=20 ps×7) and the first pass-to-fail point PFP1 is 1860 ps (=20 ps×93), the first eye width MEW1 may be a difference 1720 ps (=1860 −140), or may be based on the difference. Here, the numerical values of the first fail-to-pass point FPP1, the first pass-to-fail point PFP1, and the first eye width MEW1 are merely examples.

Another example of finding the first fail-to-pas point FPP1 will be described using FIG. 7.

Specifically, the first signal S1 having the first delay 1L fails to match the synch with the second signal S2, and is determined as a fail (F).

Subsequently, the first signal S1 having a second delay (e.g., 10L) larger than the first delay 1L by a first value (e.g., V1) may synchronize with the second signal S2, and is determined as a pass (P).

Next, the first signal S1 having a third delay (e.g., 4L) smaller than the second delay (e.g., 10L) by a second value V2 is determined as a fail. Here, the second value V2 is smaller than the first value V1.

Next, the first signal S1 having a fourth delay (e.g., 7L) greater than the third delay (e.g., 4L) by a third value V3 is determined as a pass. Here, the third value V3 is smaller than the second value V2.

Next, the first signal S1 having a fifth delay (e.g., 5L) smaller than the fourth delay (e.g., 7L) by a fourth value V4 is determined as a fail. Here, the fourth value V4 is smaller than the third value V3.

Next, the first signal S1 having a sixth delay (e.g., 6L) greater than the fifth delay (e.g., 5L) by a fifth value V5 is determined as a pass. Here, the fifth value V5 is smaller than the fourth value V4.

If a difference (i.e., V5) between the previous delay (e.g., 5L) and the current delay (e.g., 6L) is equal to or less than a preset value (e.g., 20 ps), and the first signal S1 having the current delay (e.g., 6L) is determined as a pass, the first fail-to-pass point FPP1 is determined.

As explained in FIG. 6, when the delays are increased sequentially (e.g., when increased sequentially from the first delay), it may take a considerable amount of time to check for pass/fail.

On the other hand, when checking for pass/fail while increasing or decreasing the delay as described in FIG. 7, it may be possible to reduce the time taken for checking pass/fail.

Another example of finding the first pass-to-fail point PFP1 will be described using FIG. 8.

Specifically, the first signal S1 having the first delay (e.g., 100L) fails to match the synch with the second signal S2, and is determined as a fail (F).

Next, the first signal S1 having a second delay (e.g., 92L) smaller than the first delay (e.g., 100L) by the first value V11 is determined as a pass (P).

Subsequently, the first signal S1 having a third delay 96L greater than the second delay (e.g., 92L) by the second value V12 is determined as a fail (F). Here, the second value V12 is less than the first value V11.

Subsequently, the first signal S1 having a fourth delay 95L smaller than the third delay (e.g., 96L) by the third value V13 is determined as a pass (P). Here, the third value V13 is smaller than the second value V12.

If a difference (i.e., V13) between the previous delay (e.g., 96L) and the current delay (e.g., 95L) is equal to or smaller than a specific or dynamically determined or preset value (e.g., 20 ps), and the first signal S1 having the current delay (e.g., 95L) is determined as a pass, the first pass-to-fail point PFP1 is determined.

According to the method described using FIGS. 6 to 8, the first fail-to-pass point FPP1 and the first pass-to-fail point PFP1 are determined on each of the plurality of devices to be tested, on the basis of the first operation speed SP1. Some example embodiments may include some features from FIG. 6, and may also include some features from FIG. 7 and/or FIG. 8.

The interval between the first fail-to-pass point FPP1 and the first pass-to-fail point PFP1 is calculated to calculate the first eye width MEW1 corresponding to the first operation speed SP1.

In the same manner, a second fail-to-pass point FPP2 and a second pass-to-fail point PFP2 are determined on each of the plurality of devices to be tested, on the basis of the second operation speed SP2 different from the first operation speed SP1. The interval between the second fail-to-pass point FPP2 and the second pass-to-fail point PFP2 is calculated to calculate the second eye width MEW2 corresponding to the second operation speed SP2.

Meanwhile, the first operation speed SP1 and the second operation speed SP2 may be selected differently depending on the design. For example, the operation speeds may be or may be based upon, but are not limited to, the slowest operation speed (min. operation speed) and the fastest operation speed (max. operation speed) within the range of operation speeds that require test.

Next, referring back to FIG. 5, the machine learning is performed on the calculated first and second eye widths to derive a model that shows a relation between the operation speed and the eye width (S320).

Specifically, referring to FIG. 9, an x-axis represents the operation speed, and a y-axis represents calculated the eye width. The x-axis shows six operation speeds (SP1, SP11, SP12, SP13, SP14, and SP2) that need to be tested, but not limited thereto.

FIG. 9 shows that the eye width corresponding to the slowest operation speed SP1 and the fastest operation speed SP2 have already been calculated, among the six operation speeds SP1, SP11, SP12, SP13, SP14, and SP2.

For example, since the first eye width MEW1 corresponding to the first operation speed SP1 was calculated for each of the plurality of first devices to be tested, the calculated plurality of first eye widths MEW1 are shown (see reference numeral 91). Further, since the second eye width MEW2 corresponding to the second operation speed SP2 was calculated for each of the plurality of first devices to be tested, the calculated plurality of second eye widths MEW2 are shown (see reference numeral 96).

Performing of the machine learning on the first eye width MEW1 and second eye width MEW2 thus calculated may include learning of a regression model such as a linear regression model. The linear regression model may be either a simple linear regression model (univariate linear regression model) or a multiple linear regression model (multivariate linear regression model).

The simple linear regression is represented by formula of $H(x)=wx+b$. A w value by which the independent variable x is multiplied may be referred to as a weight value, and a b value, which is a constant term, is called a bias. A gradient descent model may be used to calculate the parameters (e.g., w, b) of the simple linear regression model.

The multiple linear regression is represented by formula of $H(x)=w_1x_1+w_2x_2+ \ldots +w_nx_n+b$. The multiple linear regression is used when influenced by the plurality of independent variables ($x_1$, $x_2$, $x_n$).

Although FIG. 9 is shown as a simple linear regression model because only one independent variable is used (i.e., only one operation speed is used), the embodiment is not limited thereto. For example, when independent variables other than operation speed are also considered, the multiple linear regression model may be learned instead of the simple linear regression model.

Alternatively or additionally, supervised learning may be used as the machine learning method, but is not limited thereto. Depending on the design method, unsupervised learning and reinforcement learning may additionally or alternatively be used.

Subsequently, as shown in FIG. 5, a third eye width corresponding to a third operation speed is calculated, using the derived model (S330).

Specifically, referring to FIG. 10, a third eye width (e.g., MEW11, MEW12, MEW13, and MEW14) corresponding to the third operation speed (e.g., SP11, SP12, SP13, and SP14), other than the first operation speed SP1 and the second operation speed SP2, is calculated using the derived model (i.e., formula). For example, in the calculated model H(x)=wx+b, when SP11 is input to x, a resulting value MEW11 may be obtained.

Additionally, at the third operation speed, the position of the valid window margin may be determined.

Specifically, the third fail-to-pas point (FPL11, FPP12, FPP13, and FPP14,) is found, while adjusting the delay of the first signal S1 at the third operation speed (e.g., SP11, SP12, SP13, and SP14). The process of finding the third fail-to-pas points (FPP11, FPP12, FPP13, and FPP14) is substantially the same as described using FIGS. 6 and 7.

Subsequently, the position of the valid window margin at the third operation speed (e.g., SP11, SP12, SP13, SP14) may be determined from the third fail-to-pass point (FPP11, FPP12, FPP13, FPP14) to the point, which is obtained by adding the third eye width (FPL11, FPP12, FPP13, and FPP14) to the third fail-to-pass point (FPP11, FPP12, FPP13, and FPP14). The results are summarized in [Table 1] below.

Training is performed so that the edge of the second signal S2 is positioned at the center of the valid window margin VWM in consideration of the determined valid window margin position VWM.

TABLE 1

| Third operation speed | Third fail-to-pass point | Third eye width | Position of valid window margin |
|---|---|---|---|
| SP11 | FPP11 | MEW11 = w × SP11 + b | FPP11 to FPP11 + MEW11 |
| SP12 | FPP12 | MEW12 = w × SP12 + b | FPP12 to FPP12 + MEW12 |
| SP13 | FPP13 | MEW13 = w × SP13 + b | FPP13 to FPP13 + MEW13 |
| SP14 | FPP14 | MEW14 = w × SP14 + b | FPP14 to FPP14 + MEW14 |

Alternatively or additionally, the third pass-to-fail point (PSP11, PFP12, PFP13, and PFP14) is found, while adjusting the delay of the first signal at the third operation speed (e.g., SP11, SP12, SP13, and SP14). The process of finding the third pass-to-fail points (PFP11, PFP12, PFP13, and PFP14) is substantially the same as that described using FIGS. 6 and 8.

Subsequently, the position of the valid window margin at the third operation speed (e.g., SP11, SP12, SP13, and SP14) may be determined from the point, which is obtained by subtracting the third eye width (MEW11, MEW12, MEW13, and MEW14) from the third pass-to-fail point (PFP11, PFP12, PFP13, and PFP14), to the third pass-to-fail point (PFP11, PFP12, PFP13, and PFP14). The results are summarized in [Table 2] below.

Training is performed so that the edge of the second signal S2 is positioned at the center of the valid window margin VWM in consideration of the determined valid window margin position VWM.

TABLE 2

| Third operation speed | Third pass-to-fail point | Third eye width | Position of valid window margin |
|---|---|---|---|
| SP11 | PFP11 | MEW11 = w × SP11 + b | PFP11 − MEW11 to PFP11 |
| SP12 | PFP12 | MEW32 = w × SP12 + b | PFP12 − MEW12 to PFP12 |
| SP13 | PFP13 | MEW33 = w × SP13 + b | PFP13 − MEW13 to PFP13 |
| SP14 | PFP14 | MEW34 = w × SP14 + b | PFP14 − MEW14 to PFP14 |

According to the training method according to various example embodiments, a model showing the relation between operation speed and eye width is derived, using the machine learning, and eye widths corresponding to each of the plurality of operation speeds may be calculated using this model. Therefore, the overall training time is reduced.

Figure 11:
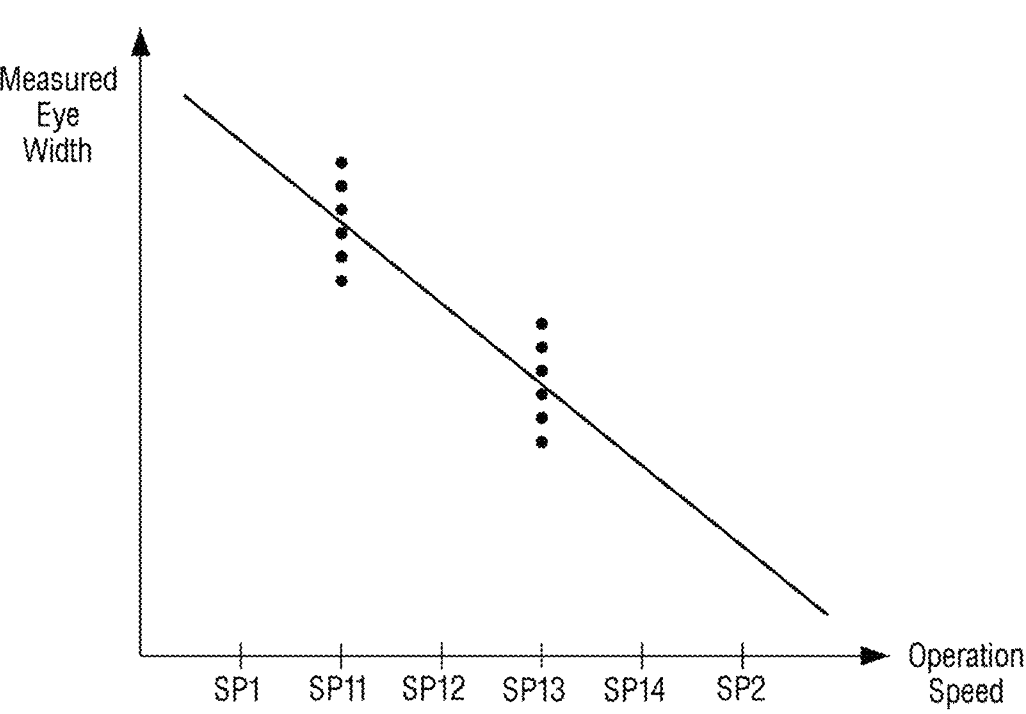
FIG. 11 is a diagram for explaining a training method according to various example embodiments.

FIG. 11 is a diagram for explaining a training method according to various example embodiments. For convenience of explanation, the explanation will be provided mainly on the points that are different from those explained using FIGS. 5 to 10.

FIG. 9 shows the calculation of the eye widths corresponding to the slowest operation speed SP1 or the fastest operation speed SP2 among the plurality of operation speeds SP1, SP11, SP12, SP13, SP14 and SP2.

On the other hand, FIG. 11 shows the calculation of the eye widths corresponding to other operation speeds (e.g., SP11, SP13) other than the slowest operation speed SP1 or the fastest operation speed SP2, among the plurality of operation speeds SP1, SP11, SP12, SP13, SP14, and SP2. Even in such a case, it is possible to derive a model showing the relation between the operation speed and the eye width, by performing the machine learning as in the method described above.

Further, the eye widths corresponding to two or more operation speeds among the operation speeds SP1, SP11, SP12, SP13, SP14, and SP2 that require the test may be calculated and used for the machine learning. For example, the eye widths corresponding to the slowest operation speed SP1, the fastest operation speed SP2, and another operation speed (e.g., SP12) may be calculated and used. Because more data are used for the machine learning, more accurate models may be derived.

Figure 12:
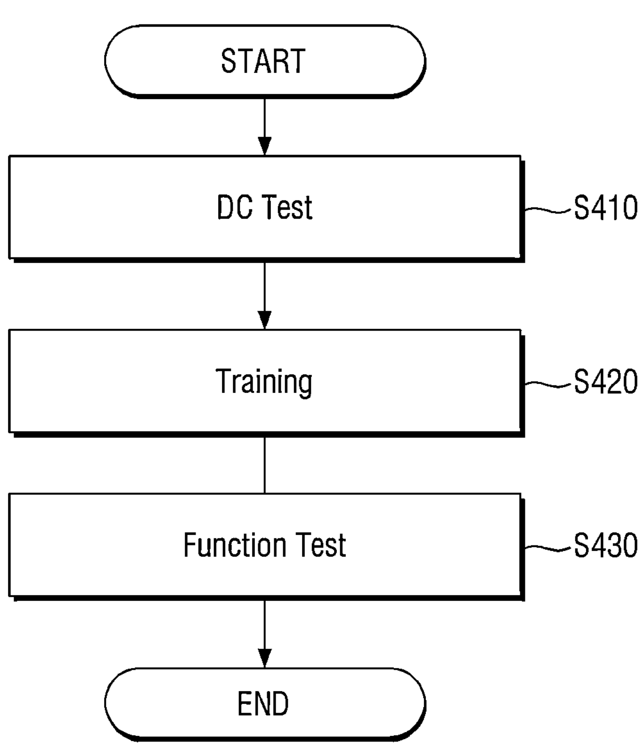
FIG. 12 is a flow chart for explaining a training method according to various example embodiments.

FIG. 12 is a flow chart for explaining a training method according to various example embodiments. For convenience of explanation, the explanation will focus on points different from those explained using FIGS. 5 to 11.

Referring to FIG. 12, first, a DC test is performed (S410). A test apparatus (see 100 of FIG. 1) applies a DC voltage to the device to be tested to test the DC characteristics of the device to be tested.

Subsequently, the test apparatus performs the training operation (S420). The training operation proceeds according to the method using FIGS. 1 to 11.

Subsequently, the functional test of the device to be tested is performed. The functional test includes the write and read performance, the data transfer performance in paths formed in the process of testing the write and read performance, and the like. For example, it is tested whether the device to be tested operates correctly at a plurality of operation speeds, using the first signal S1 and the second signal S2 which synchronize each other by the training operation.

Figure 13:
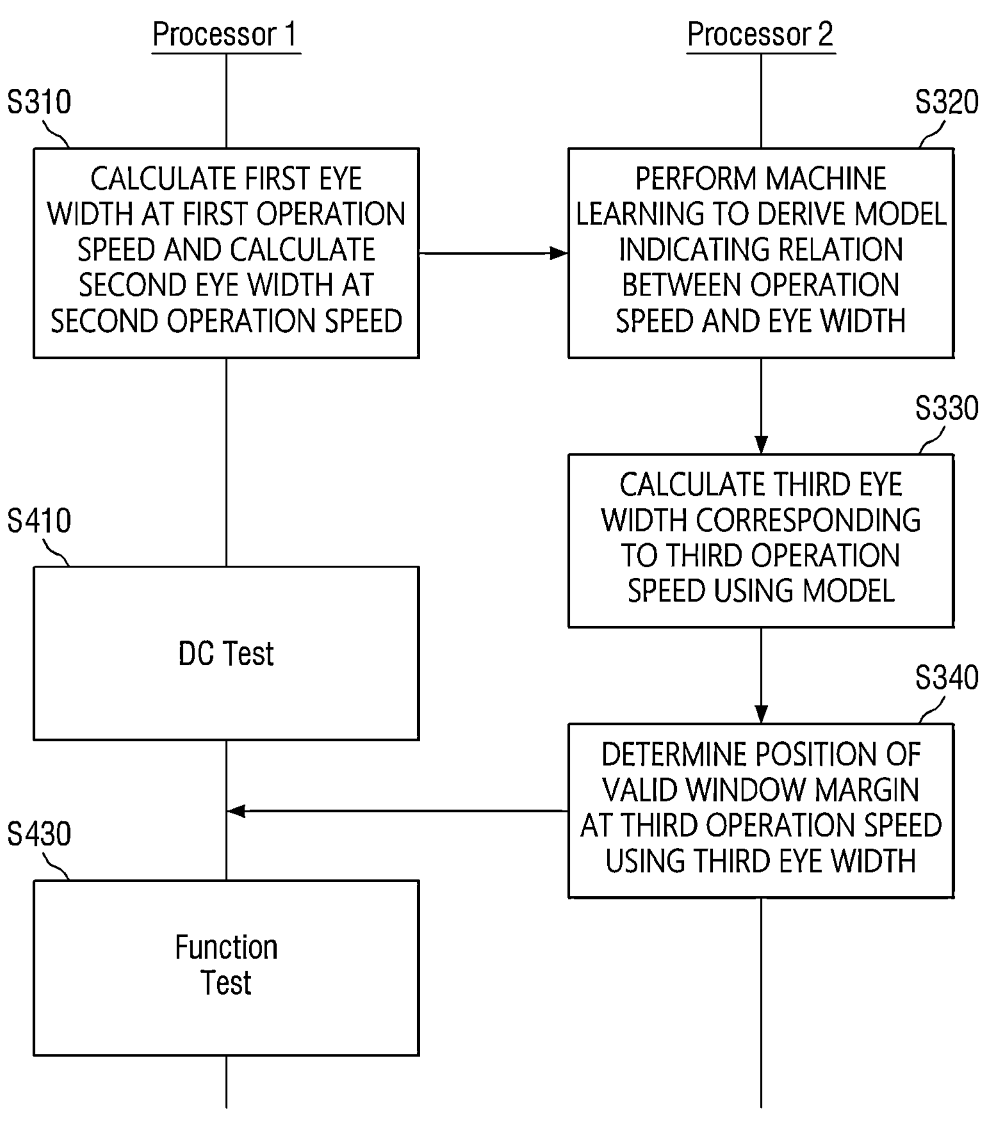
FIG. 13 is a flow chart for explaining a training method according to various example embodiments.

FIG. 13 is a flow chart for explaining a training method according to a fourth embodiment of the present invention. For convenience of explanation, the explanation will focus on points different from those explained using FIG. 12.

Referring to FIG. 13, a test apparatus according to another embodiment of the present invention includes a plurality of processors (Processor 1, Processor 2).

To reduce overall test time, a first processor (Processor 1) and a second processor (Processor 2) may share training-related tasks. For example, the first processor (Processor 1) controls the timing generator 110, and the second processor (Processor 2) may perform tasks related to computation (e.g., a model derivation using the machine learning, an eye width calculation using the model, and a valid window margin positioning).

Specifically, the first processor (Processor 1) calculates the first eye width at the first operation speed, and calculates the second eye width at the second operation speed (S310).

The second processor (Processor 2) performs the machine learning on the calculated first and second eye widths to derive a model showing the relation between the operation speed and the eye width (S320). Next, the second processor (Processor 2) calculates the third eye width corresponding to the third operation speed, using the model (S330). The second processor (Processor 2) determines the valid window margin position at the third operation speed, using the calculated third eye width (S340). The training is performed so that the edge of the second signal S2 is positioned at the center of the valid window margin VWM in consideration of the determined position of the valid window margin VWM.

While the second processor (Processor 2) performs the machine learning to derive a model (see S320) or calculates the third eye width using the derived model (see S330), the first processor (Processor 1) performs the DC test (S410).

After the step S340 is completed, the first processor (Processor 1) performs the functional test on the basis of the training result (S430).

For example, while the second processor (Processor 2) performs some operations (S320, S330) during training, the first processor (Processor 1) performs the DC test (S410). In this way, the overall test time can be reduced by using the plurality of processors (Processor 1, Processor 2).

Since the DC test (S410) and training are performed in parallel as in FIG. 13, rather than the case of sequentially performing the DC test (S410), the training (S420), and the functional test (S430) as in FIG. 12, the overall test time decreases. In some example embodiments, after or during the functional test (S430) some repair and/or redundancy operations may be performed, e.g. by the test equipment 100, to replace defective cells with operational cells. The redundancy may be performed based on the results of the training (S420).

Figure 14:
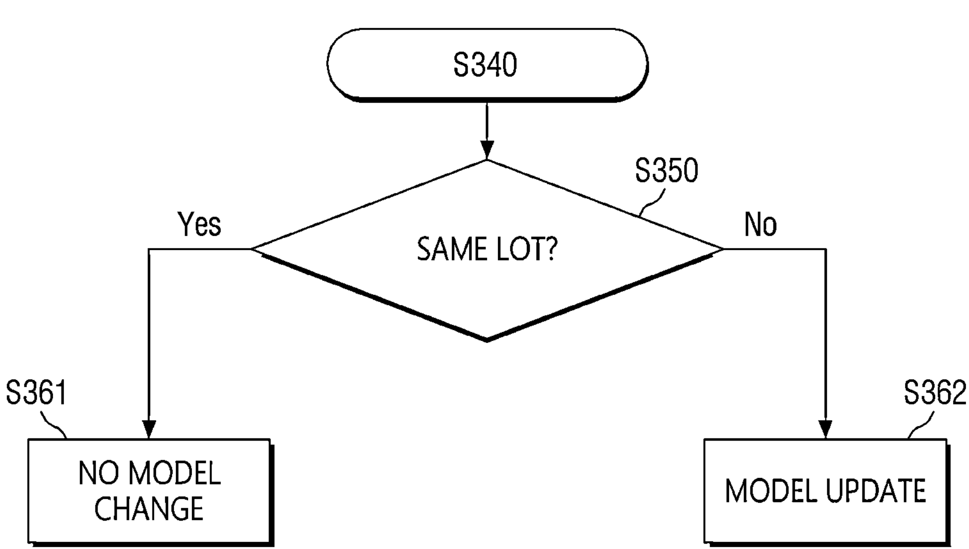
FIG. 14 is a flow chart for explaining a training method according to various example embodiments.

FIG. 14 is a flow chart for explaining a training method according to a fifth embodiment of the present invention. Update timing of the model will be described using FIG. 14.

Referring to FIG. 14, the plurality of devices to be tested are tested simultaneously. When the test is finished, a plurality of new devices to be tested are loaded. It is checked whether the newly loaded devices to be tested belong to the same lot (LOT) or are from the same wafer/substrate or from a same position on the wafer/substrate as the previous devices to be tested (S350).

If the plurality of devices belong to the same lot (for example, Yes of S350), the model is not changed (S361). For example, another model indicating the relation between the operation speed and the eye width is not newly derived for the new devices to be tested. When calculating the eye widths associated with the plurality of new devices to be tested, the previously used model is used as it is.

If they belong to another lot (that is, No of S350), the model is updated (S362). That is, steps S310, S320, S330, and S340 are performed on the plurality of new devices to be tested. The updated model is used when calculating eye widths associated with the plurality of new devices to be tested.

As a result of experiments of the inventors, since the memory devices in the same lot have similar eye widths, when testing the memory devices in the same lot, it was checked that the model may not be or may not be required to be updated. By doing so, the overall test time may be shortened.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

In concluding the detailed description, those of ordinary skill in the art will appreciate that many variations and modifications may be made to various example embodiments without substantially departing from the principles described herein. Therefore, various example embodiments are used in a generic and descriptive sense only and not for purposes of limitation. Furthermore example embodiments are not necessarily mutually exclusive with one another. For example, some example embodiments may include one or more features described with reference to one or more figures, and may also include one or more other features described with reference to one or more other figures.

What is claimed is:

1. A training method comprising:

for each of first devices to be tested, calculating a first eye width at which a first signal and a second signal synchronize with each other at a first operation speed, and calculating a second eye width at which the first signal and the second signal synchronize with each other at a second operation speed different from the first operation speed;

deriving a model showing a relation between operation speeds and eye widths by performing machine learning on the first eye width and the second eye width; and using the model to calculate a third eye width corresponding to a third operation speed different from the first operation speed and the second operation speed.

2. The training method of claim 1, wherein performing the machine learning comprises learning of a linear regression model.

3. The training method of claim 2, wherein a gradient descent method is used to calculate parameters of the linear regression model.

4. The training method of claim 1, wherein the calculating of the first eye width comprises:

while adjusting a delay of the first signal at the first operation speed, finding a first fail-to-pass point and a first pass-to-fail point, and determining the first eye width based on an interval between the first fail-to-pass point and the first pass-to-fail point.

5. The training method of claim 4, wherein finding of the first fail-to-pass point comprises:

determining the first signal having a first delay, as a fail, determining the first signal having a second delay greater than the first delay by a first value, as a pass, determining the first signal having a third delay less than the second delay by a second value, as a fail, the second value being less than the first value, and determining the first signal having a fourth delay greater than the third delay by a third value, as a pass, the third value being smaller than the second value.

6. The training method of claim 4, wherein finding of the first pass-to-fail point comprises:

determining the first signal having a first delay, as a fail, determining the first signal having a second delay less than the first delay by a first value, as a pass, determining the first signal having a third delay greater than the second delay by a second value, as a fail, the second value being less than the first value, and determining the first signal having a fourth delay smaller than the third delay by a third value, as a pass, the third value being less than the second value.

7. The training method of claim 1, further comprising:

determining a position of a valid window margin at the third operation speed, wherein determining of the position of the valid window margin at the third operation speed includes:

finding a third fail-to-pass point, while adjusting a delay of the first signal at the third operation speed, and determining from the third fail-to-pass point to a point obtained by adding the third eye width to the third fail-to-pass point, as the position of the valid window margin.

8. The training method of claim 1, further comprising:

determining a position of a valid window margin at the third operation speed, wherein determining of the position of the valid window margin at the third operation speed includes:

finding a third pass-to-fail point while adjusting a delay of the first signal at the third operation speed, and determining from a point, which is obtained by subtracting the third eye width from the third pass-to-fail point, to the third pass-to-fail point, as the position of the valid window margin.

9. The training method of claim 1, wherein the first signal corresponds to a DQ signal, and the second signal corresponds to a DQS signal.

10. The training method of claim 1, wherein when second devices to be tested belong to a same lot as the first devices to be tested, no model showing the relation between operation speeds and eye widths is separately derived for the second devices to be tested, and the model derived for the first devices to be tested is used, when calculating eye widths associated with the second devices to be tested.

11. The training method of claim 1, wherein when third devices to be tested belong to a different lot from the first devices to be tested, the model derived for the first devices to be tested is updated, and the updated model is used, when calculating eye widths associated with the third devices to be tested.

12. The training method of claim 1, wherein the calculating of the first eye width and the second eye width is performed by a first processor, and the deriving of the model showing the relation between operation speeds and eye widths is performed by a second processor.

13. The training method of claim 12, wherein the first processor performs a DC test on each of the first devices to be tested, after calculating the first eye width and the second eye width.

14. A training method comprising:

for each of first devices to be tested, calculating a first eye width at which a first signal and a second signal synchronize with each other at a first operation speed, and calculating a second eye width at which the first signal and the second signal synchronize with each other at a second operation speed different from the first operation speed;

performing machine learning on the first eye width and the second eye width to derive a linear regression model showing a relation between operation speeds and eye widths by using a gradient descent method to calculate parameters of the linear regression model;

calculating a third eye width corresponding to a third operation speed, using the linear regression model;

finding a third fail-to-pass point, while adjusting a delay of the first signal at the third operation speed; and determining from the third fail-to-pass point to a point obtained by adding the third eye width to the third fail-to-pass point, as a position of a valid window margin.

15. The training method of claim 14, wherein when second devices to be tested belong to a same lot as the first devices to be tested, no model showing the relation between operation speeds and eye widths is separately derived for the second devices to be tested, the model derived for the first devices to be tested is used, when calculating eye widths associated with the second devices to be tested, and wherein when third devices to be tested belong to a different lot from the first devices to be tested, the model derived for the first devices to be tested is updated, and the updated model is used, when calculating eye widths associated with the third devices to be tested.

16. A test apparatus comprising:

output nodes configured to electrically connect to first devices to be tested;

a timing generator configured to provide a first signal and a second signal to the first devices to be tested through the output nodes; and a controller configured to control the timing generator, wherein the controller is configured to calculate a first eye width at which the first signal and the second signal synchronize with each other at a first operation speed, and calculate a second eye width at which the first signal and the second signal synchronize with each other at a second operation speed different from the first operation speed, for each of first devices to be tested, wherein the controller is configured to perform machine learning on the first eye width and the second eye width to derive a model showing a relation between operation speeds and eye widths, and wherein the controller is configured to calculate a third eye width corresponding to a third operation speed different from the first operation speed and the second operation speed by using the model.

17. The test apparatus of claim 16, wherein the controller is configured to perform the machine learning by learning of a linear regression model, and the controller is configured to calculate parameters of the linear regression model using a gradient descent method.

18. The test apparatus of claim 16, wherein the controller is configured to calculate the first eye width by, finding a first fail-to-pass point and a first pass-to-fail point, while adjusting a delay of the first signal at the first operation speed, and determining an interval between the first fail-to-pass point and the first pass-to-fail point as the first eye width.

19. The test apparatus of claim 18, wherein the controller is configured to find of the first fail-to-pass point by, determining the first signal having a first delay, as a fail, determining the first signal having a second delay greater than the first delay by a first value, as a pass, determining the first signal having a third delay less than the second delay by a second value, as a fail, the second value being smaller than the first value, and determining the first signal having a fourth delay greater than the third delay by a third value, as a pass, the third value being less than the second value.

20. The test apparatus of claim 16, wherein the controller is further configured to:

determine a position of a valid window margin at the third operation speed, wherein the determining of the position of the valid window margin at the third operation speed includes:

finding a third fail-to-pass point, while adjusting a delay of the first signal at the third operation speed, and determining from the third fail-to-pass point to a point obtained by adding the third eye width to the third fail-to-pass point, as the position of the valid window margin.

* * * * *